(12) United States Patent
Kim et al.

(10) Patent No.: US 9,217,550 B2
(45) Date of Patent: Dec. 22, 2015

(54) LIGHTING APPARATUS

(75) Inventors: Kyunghyun Kim, Seoul (KR); Sejoon You, Seoul (KR); Seokhoon Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 750 days.

(21) Appl. No.: 13/440,269

(22) Filed: Apr. 5, 2012

(65) Prior Publication Data

US 2013/0107519 A1    May 2, 2013

(30) Foreign Application Priority Data

Oct. 28, 2011 (KR) ........................ 10-2011-0110935

(51) Int. Cl.
| | |
|---|---|
| *F21V 1/00* | (2006.01) |
| *F21V 3/04* | (2006.01) |
| *F21S 4/00* | (2006.01) |
| *H05K 1/18* | (2006.01) |
| *F21V 7/00* | (2006.01) |
| *F21V 7/16* | (2006.01) |
| *F21V 11/14* | (2006.01) |
| *F21V 13/04* | (2006.01) |
| *F21V 19/02* | (2006.01) |
| *F21V 23/00* | (2015.01) |
| *F21V 23/04* | (2006.01) |
| *F21S 2/00* | (2006.01) |
| *F21S 8/04* | (2006.01) |
| *F21S 8/06* | (2006.01) |

(52) U.S. Cl.
CPC .............. *F21V 3/0445* (2013.01); *F21S 4/003* (2013.01); *F21S 4/005* (2013.01); *F21V 7/0016* (2013.01); *F21V 7/16* (2013.01); *F21V 11/14* (2013.01); *F21V 13/04* (2013.01); *F21V 19/02* (2013.01); *F21V 23/008* (2013.01); *F21V 23/0435* (2013.01); *H05K 1/189* (2013.01); *F21S 2/005* (2013.01); *F21S 8/04* (2013.01); *F21S 8/06* (2013.01)

(58) Field of Classification Search
CPC ............ H05K 1/189; F21S 4/003; F21S 4/005
USPC .............................................. 362/249.04, 235
See application file for complete search history.

(56) References Cited

U.S. PATENT DOCUMENTS

| 6,504,487 B1 * | 1/2003 | Pederson .................. 340/815.45 |
| 6,561,665 B1 * | 5/2003 | Kim .............................. 362/604 |
| 7,198,388 B2 * | 4/2007 | Pilby ............................ 362/325 |
| 7,248,308 B2 * | 7/2007 | Mizutani et al. ................ 349/67 |

(Continued)

FOREIGN PATENT DOCUMENTS

| JP | 2011-108424 A | 6/2011 |
| JP | 2011-119180 A | 6/2011 |

(Continued)

OTHER PUBLICATIONS

Korean Notice of Allowance dated Oct. 4, 2012 issued in Application No. 10-2011-0110935 (with English translation).

*Primary Examiner* — Robert May
*Assistant Examiner* — Bryon T Gyllstrom
(74) *Attorney, Agent, or Firm* — Ked & Associates, LLP

(57) ABSTRACT

There is disclosed a lighting apparatus that can light a room intensively, fitted to a characteristic of a room, by adjusting an angle of light distribution and that can prevent glare, with improved optical uniformity and beautiful exterior appearance.

23 Claims, 9 Drawing Sheets

(56) References Cited

U.S. PATENT DOCUMENTS

| | | | |
|---|---|---|---|
| 7,726,828 B2 * | 6/2010 | Sato | 362/97.3 |
| 8,197,103 B2 * | 6/2012 | Chang et al. | 362/311.02 |
| 2005/0138852 A1 * | 6/2005 | Yamauchi | 40/582 |
| 2007/0274097 A1 * | 11/2007 | Chen et al. | 362/609 |
| 2010/0053133 A1 * | 3/2010 | Furuta | 345/207 |
| 2010/0220472 A1 * | 9/2010 | Dahm | 362/231 |
| 2010/0315811 A1 * | 12/2010 | Chen et al. | 362/235 |
| 2010/0321953 A1 * | 12/2010 | Coleman et al. | 362/607 |
| 2011/0018025 A1 | 1/2011 | Bertram | 257/99 |

FOREIGN PATENT DOCUMENTS

| | | |
|---|---|---|
| KR | 10-0750181 B1 | 8/2007 |
| KR | 10-2010-0007595 A | 1/2010 |
| KR | 10-2011-0000744 A | 1/2011 |
| KR | 10-1123790 B1 | 3/2012 |

* cited by examiner (a)

(b)

(c)

LIGHTING APPARATUS

CROSS REFERENCE TO RELATED APPLICATION

Pursuant to 35 U.S.C. §119(a), This application claims the benefit of the Patent Korean Application No. 10-2011-0110935, filed on Oct. 28, 2011, which is hereby incorporated by reference as if fully set forth herein.

BACKGROUND OF THE DISCLOSURE

1. Field of the Disclosure

The present invention relates to a lighting apparatus, more particularly, to a lighting apparatus that can light a room intensively, fitted to a characteristic of a room, by adjusting an angle of light distribution and that can prevent glare, with improved optical uniformity and beautiful exterior appearance.

2. Discussion of the Related Art

Generally, the lighting industry has a long history which is as old as civilization and it is closely related with human beings.

The lighting industry has been under sustainable development and various studies on light sources, a light-emitting method, a driving module and lighting efficiency improvement have been made.

A light source usually used in a lighting apparatus may be an incandescent lamp, an electric-discharge lamp and a fluorescent lamp and such a light source is used for various purposes such as for domestic usage, landscape usage and industrial usage.

The incandescent lamp which is a resistive light source has disadvantages of deteriorated light-emitting efficiency and a generated heat. The electric-discharge lamp has disadvantages of a high price and a high voltage. The fluorescent lamp has an environmental disadvantage of mercury usage.

To solve those disadvantages of such the light sources, interests in light emitting diodes (LED) have been increasing because they have advantages of high light emitting efficiency, a variety of colors and designable freedom.

Such a light emitting diode (LED) is a semiconductor element which emits a light when a voltage is applied to the light emitting diode forwardly. The light emitting diode has a long life span of usage, low power consumption. In addition, it has electrical, optical and physical properties which are proper to mass production. Because of that, the light emitting diodes (LED) have been substituting for the incandescent lamps and fluorescent lamps rapidly.

Meanwhile, when a LED lighting apparatus is used as a simple lighting apparatus, the directionality of light (for example, a light distribution angle) may be adjusted by using a lens structure such as a condensing lens.

To adjust the directionality of the light, an auxiliary lens structure is required. Accordingly, a manufacturing process of a lighting apparatus might be complex and the manufacturing cost might be rising. Also, it is difficult for the lighting apparatus to be fitted to a characteristic of a lighted room.

SUMMARY OF THE DISCLOSURE

Accordingly, the present invention is directed to a lighting apparatus. An object of the present invention is to provide a lighting apparatus that can light a room intensively, fitted to a characteristic of a room, by adjusting an angle of light distribution and that can prevent glare, with improved optical uniformity and beautiful exterior appearance.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings. To achieve these objects and other advantages and in accordance with the purpose of the invention, as embodied and broadly described herein, a lighting apparatus includes a front cover having a light transmission part; a rear cover coupled to the front cover; a light emitting module arranged between the front cover and the rear cover, the light emitting module comprising a flexible circuit board, with a predetermined curvature having a center located toward a lighting room to increase the quantity of lights in a light distribution region, and a plurality of LEDs mounted on the flexible circuit board; an electronic module to supply an electric power to the light emitting module.

At least one of the front and rear covers may be curved at the same curvature as the flexible circuit board.

The flexible circuit board may be curved toward a direction enabling two neighboring LEDs farther to each other.

The light emitting module may include a light guide layer provided on the flexible circuit board to cover the LEDs; and a reflection layer to reflect a light reflected from the LED at a specific light distribution angle toward the light guide layer.

The area or intensity of the reflection layer may be s getting decreased as getting farther from the LED.

A plurality of scratched or dots may be formed in a bottom surface of the light guide layer to reflect a light travelling inside the light guide layer toward the front cover.

The number of the scratches or dots per unit area may be in proportion to the distance from the LED.

The lighting apparatus may further include a diffusive member arranged between the front cover and the light emitting module.

The lighting apparatus may further include a local controller to control on and off of the light emitting module.

In another aspect of the invention, a lighting apparatus includes a front cover having a light transmission part; a rear cover coupled to the front cover; a light emitting module comprising a flexible circuit board arranged between the front cover and the rear cover, with a predetermined curvature having a center positioned toward a reverse direction with respect to a lighting room to increase a light distribution region, and a plurality of LEDs mounted on the flexible circuit board; and an electronic module to provide an electric power to the light emitting module.

In a further aspect of the invention, a lighting apparatus includes a front cover having a light transmission part; a rear cover coupled to the front cover; a light emitting module arranged between the front cover and the rear cover, the light emitting module comprising a flexible circuit board and a plurality of LEDs mounted on the flexible circuit board; a driving unit to bend the flexible circuit board toward a lighting room or a reverse direction with respect to the lighting room; and an electronic module to provide an electric power to the light emitting module and the driving unit.

As described above, the lighting apparatus according to the embodiments of the invention may intensively light the lighting room by adjusting the light distribution angle and it may prevent the glare phenomenon. Also, it may improve uniformity of lighting and have an enhanced exterior appearance.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

A lighting apparatus according to a first embodiment of the present invention will be described in detail in reference to the accompanying drawings as follows. The accompanying drawings are illustrated to describe examples of the present invention and they are provided to explain the present invention more specifically, as the present invention is not limited thereto.

Reference will now be made in detail to the specific embodiments of the present invention, examples of which are illustrated in the accompanying drawings. Wherever possible, the same reference numbers will be used throughout the drawings to refer to the same or like parts. Repeated description will be omitted and the size and appearance of each part illustrated for explanation convenience may be exaggerated or minimized.

Meanwhile, terminology including ordinal numbers like 'first' and 'second' may be used to explain various parts of the present invention and the various parts are not limited by the terminology. The terminology is used only to distinguish one of the parts from the others.

Figure 1:
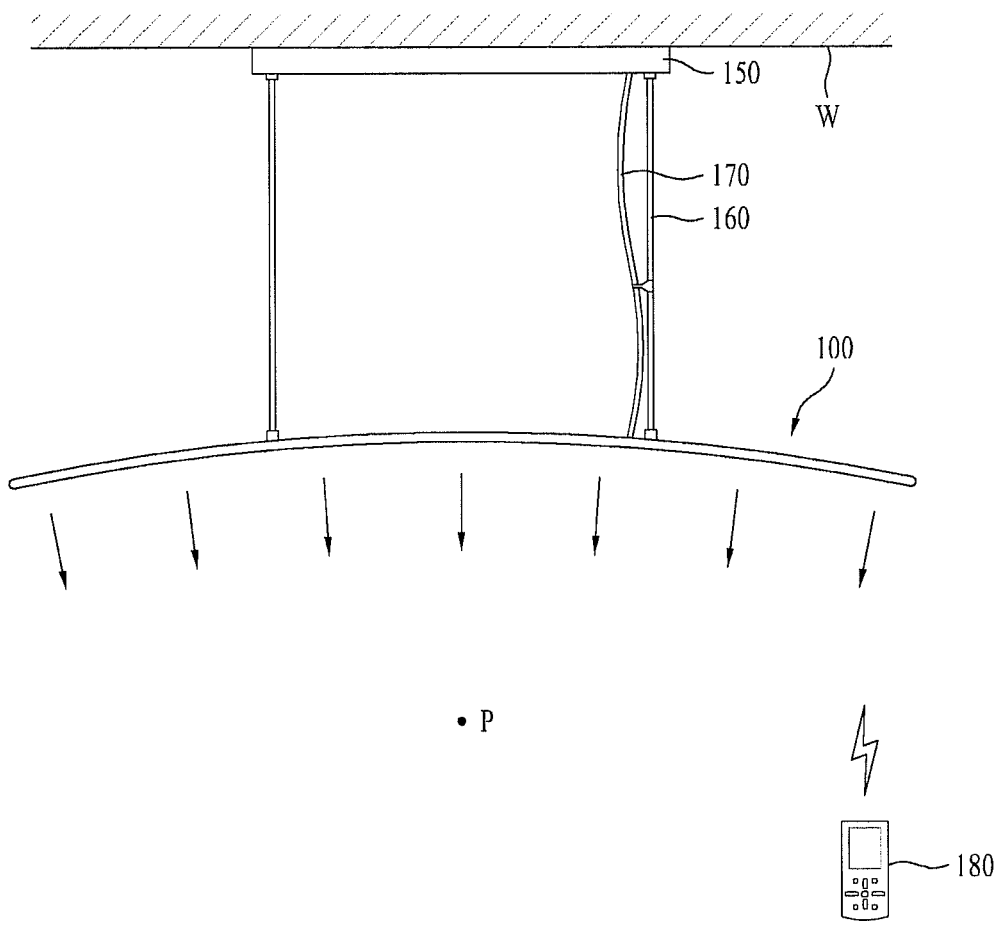
FIG. 1 is a side view illustrating a lighting apparatus according to a first embodiment of the invention.
Figure 3:
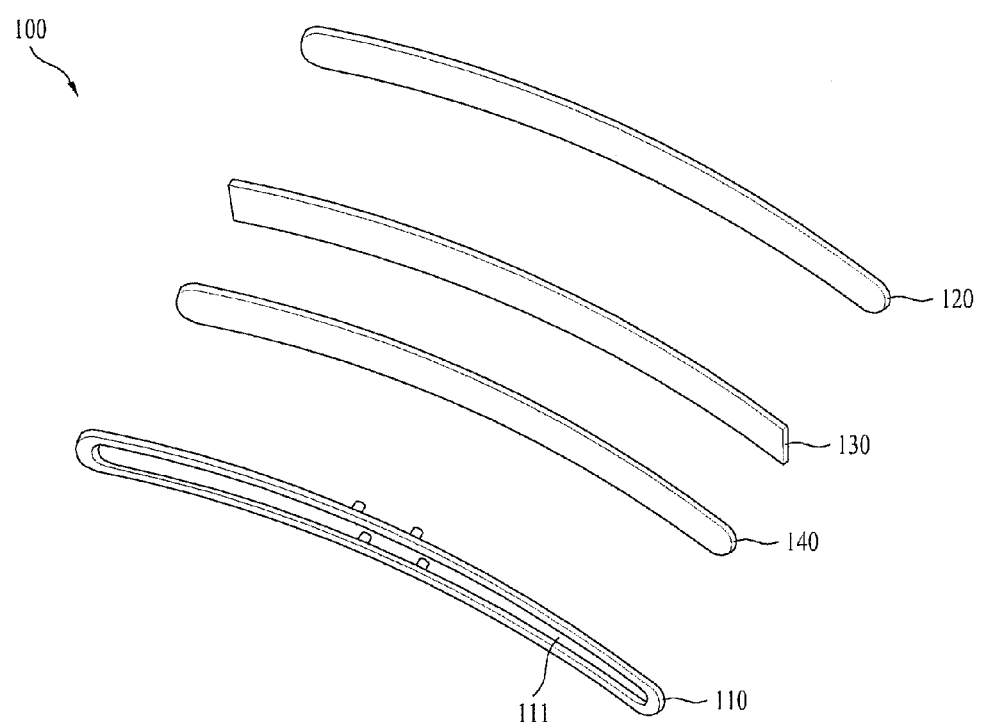
FIG. 3 is an exploded perspective view of the lighting apparatus shown in FIG. 1.
Figure 4:
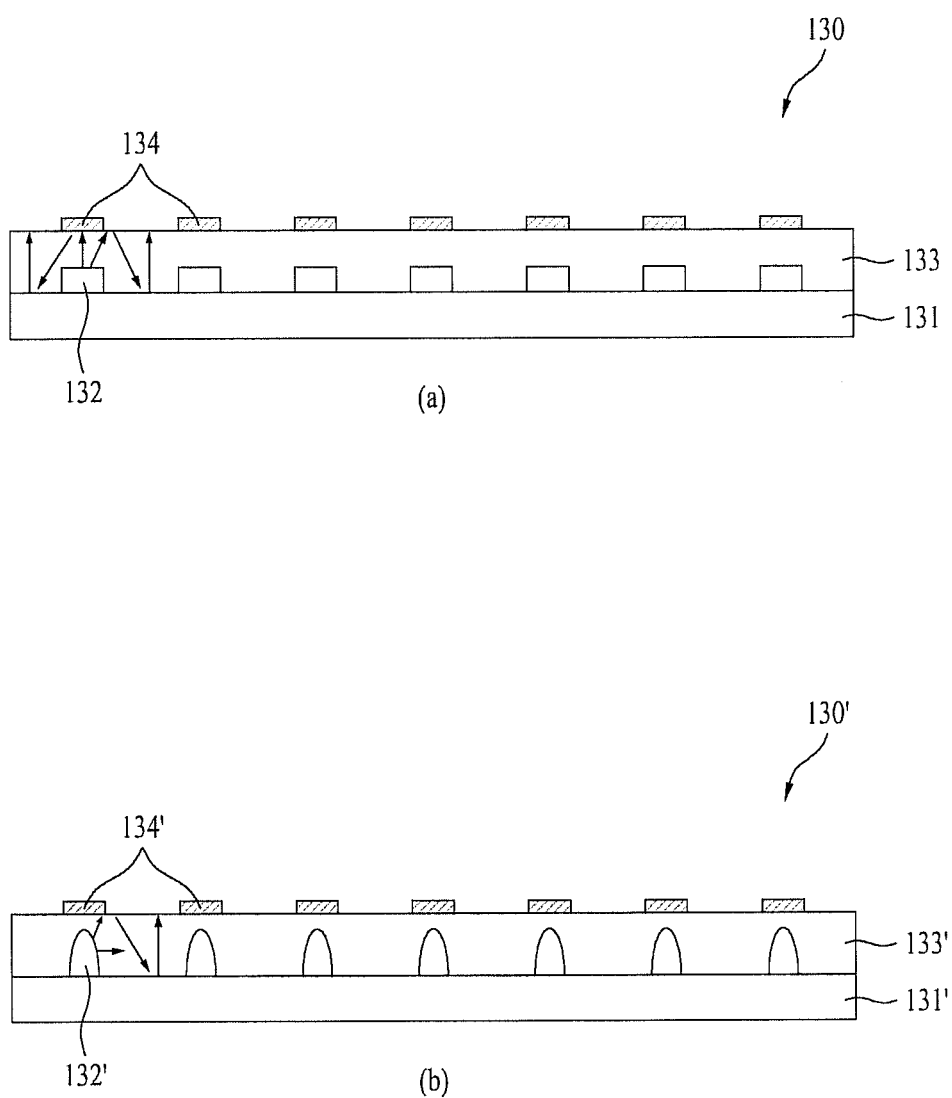
FIG. 4 is a sectional view illustrating a light emitting module composing the lighting apparatus.
Figure 8:
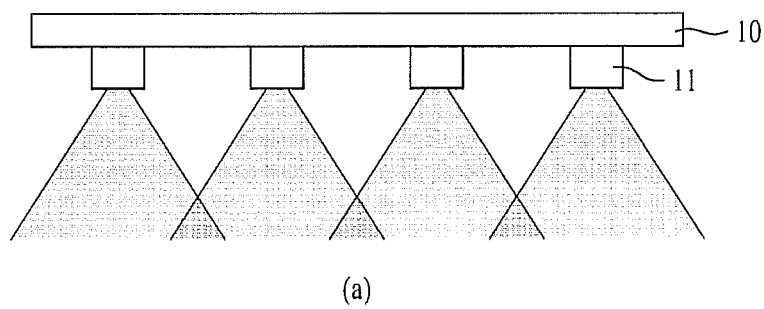
FIG. 8 is a conceptual diagram illustrating an operational state of the lighting apparatus.
Figure 8:
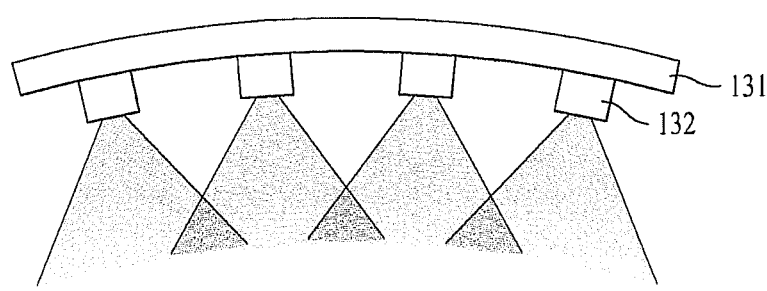
Figure 8:
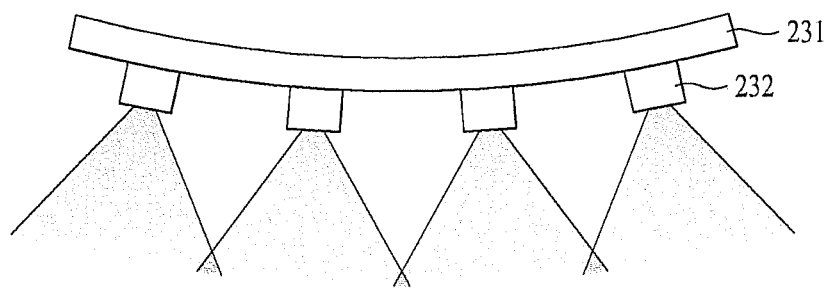

FIG. 1 is a side view illustrating a lighting apparatus according to a first embodiment of the invention. FIG. 3 is an exploded perspective view of the lighting apparatus shown in FIG. 1. FIG. 4 is a sectional view illustrating a light emitting module composing the lighting apparatus. FIG. 8 is a conceptual diagram illustrating an operational state of the lighting apparatus.

The lighting apparatus 100 according to the first embodiment includes a front cover 110 having a light transmission part 111, a rear cover 120 coupled to the front cover 110, a light emitting module 130 arranged between the front cover 110 and the rear cover 120 and an electronic module 150 to supply an electric power to the light emitting module 130. The light emitting module 130 includes a flexible circuit board 131, with a center (P) of curvature located toward a lighted space to increase the quantity of light in a light distribution region, and a plurality of LEDs 132 mounted on the flexible circuit board 131.

Also, the lighting apparatus 100 may further include a diffusive member 140 arranged between the front cover 110 and the light emitting module 130. The diffusive member 140 may diffuse the lights to enable the lighting apparatus to light to a surface light source and it may prevent glare.

The lighting apparatus 100 may further include a local controller 180 to control on and off of the light emitting module 130. A user may use the local controller 180 in turning on the lighting apparatus 100 or turning off the lighting apparatus 100 and in controlling dimming of the lighting apparatus 100.

Typically, the lighting apparatus 100 may be installed on a ceiling of the room as a chandelier type. In this instance, the electronic module 150 may be installed on a wall (W) and the front and rear covers 110 and 120 may be mechanically connected to the electronic module 150 by at least one supporting member 160. The electronic module 150 and the light emitting module 130 may be electrically connected with each other via a cable 160.

Meanwhile, the lighting apparatus 100 has a predetermined light distribution angle because of characteristics of the LEDs 132 used as the light sources. Unless such a light distribution angle is adjusted, the lights might be irradiated toward an unnecessary room and the quantity of the lights irradiated to the required room might be insufficient.

The lighting apparatus 100 according to the first embodiment may have a structure enabling intensive lighting, fitted to the characteristics of the lighted room In reference to FIGS. 1 to 8, the light emitting module 130 has a curved appearance with a center (P) of curvature located toward the lighting room to enable the flexible circuit board 131 to increase the quantity of the lights in a light distribution region. Specifically, in reference to FIG. 8 (b), the flexible circuit board 131 may be curved toward a direction enabling two neighboring LEDs farther to each other.

In reference to FIG. 8 (a) and FIG. 8 (b), when the circuit board 131 where the LEDs 132 are mounted is flat like a plate (see FIG. 8 (a)), the light emitting module 130 according to this embodiment has the structure which can increases the quantity of the lights in an overlapped region of a light distribution region of two neighboring LEDs 132.

In other words, an entire light distribution angle of the light emitting module 130 according to the first embodiment is smaller than a light distribution angle of a light emitting module shown in FIG. 8 (a). Accordingly, the light emitting module 130 according to this embodiment has the structure capable of increasing the quantity of the lights irradiated to the light distribution region.

Also, the front cover 110 and the rear cover 120 may have a corresponding appearance to the curved appearance of the flexible circuit board 131. For example, at least one of the first and second covers may be curved along the same direction of the flexible circuit board 131. It is preferable that the front cover 11 and the rear cover 120 are curved along the same direction of the flexible circuit board 131 to have an excellent exterior appearance.

Also, at least one of the front and rear covers 110 and 120 may be curved at the same curvature as the flexible circuit board 131. It is preferable that the front cover 110 and the rear cover 120 are curved at the same curvature as the curvature of the flexible circuit board 131.

In this instance, the flexible circuit board 131 is coupled to the rear cover 120 and the curved appearance of the flexible circuit board 131 may be maintained by the curvature of the rear cover 120.

In reference to FIG. 4, the light emitting module 130 and 130' includes a light guide layer 133 and 133' provided in the flexible circuit board 131 and 131' to cover the LED 123 and 123' and a reflection layer 134 and 134' to reflect the light reflected from the LED 132 and 132' having a predetermined light distribution angle toward the light guide layer 133 and 133'.

Meanwhile, the light guide layer 133 and 133' may be formed of a resin material having a high light transmissivity.

The light emitting module 130 and 130' may be classified into a direct type and an edge type based on a direction of a light irradiated from the LED 132 and 132'.

In reference to FIG. 4 (a), the direct type light emitting module 130 has the LEDs 132 to irradiate lights toward the front cover 120. At this time, the reflection layer 134 may prevent the light irradiated from the LED 132 from being directly emitted outside via the front cover 120, to prevent a point source of light that might generate the glare, and it may reflect the light irradiated from the LED 132 to emit it outside via the light guide layer 133.

Also, in reference to FIG. 4 (b), the edge type light emitting module 130' has the LEDs 132' to irradiate lights toward the inside of the light guide layer 133'. At this time, the reflection layer 134 prevents the light irradiated from the LED 132' from being directly emitted outside via the front cover 120 to prevent a point source type lighting that might generate the glare and it reflect the light irradiated from the Led 132' to emit the light outside via the light guide layer 133.

Figure 5:
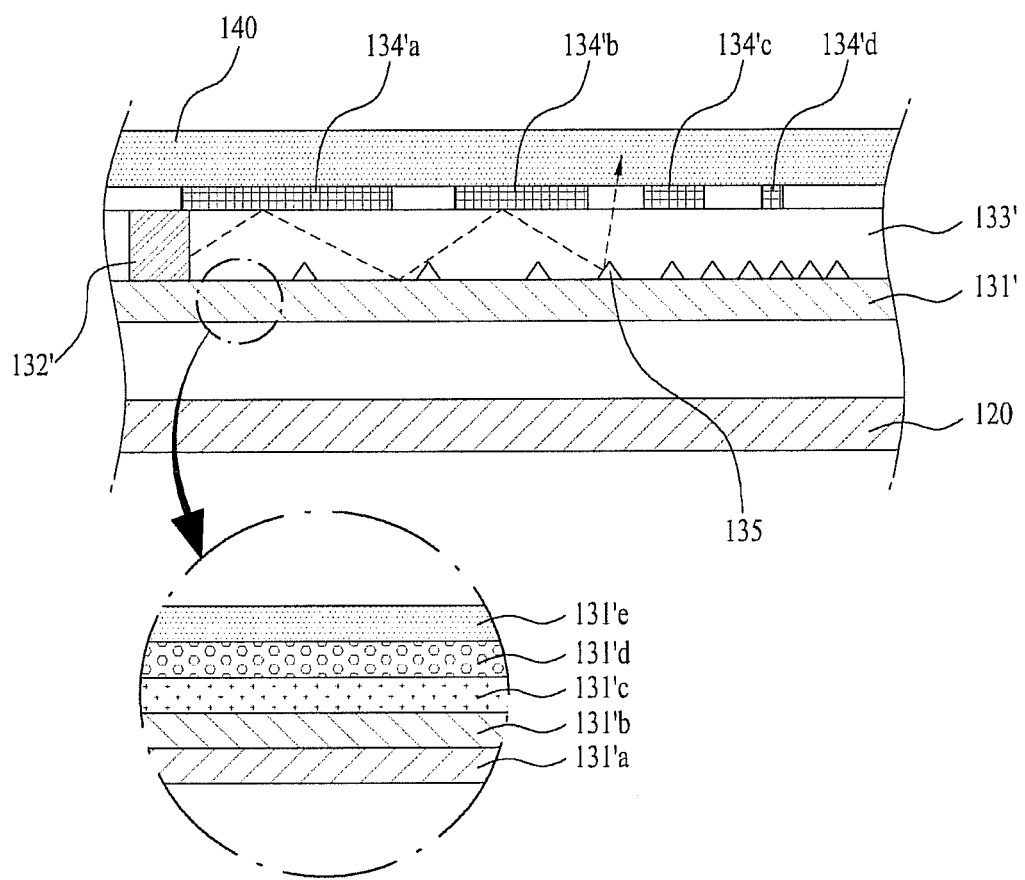
FIGS. 5 to 7 are diagrams illustrating an operational state of the light emitting module composing the lighting apparatus.
Figure 6:
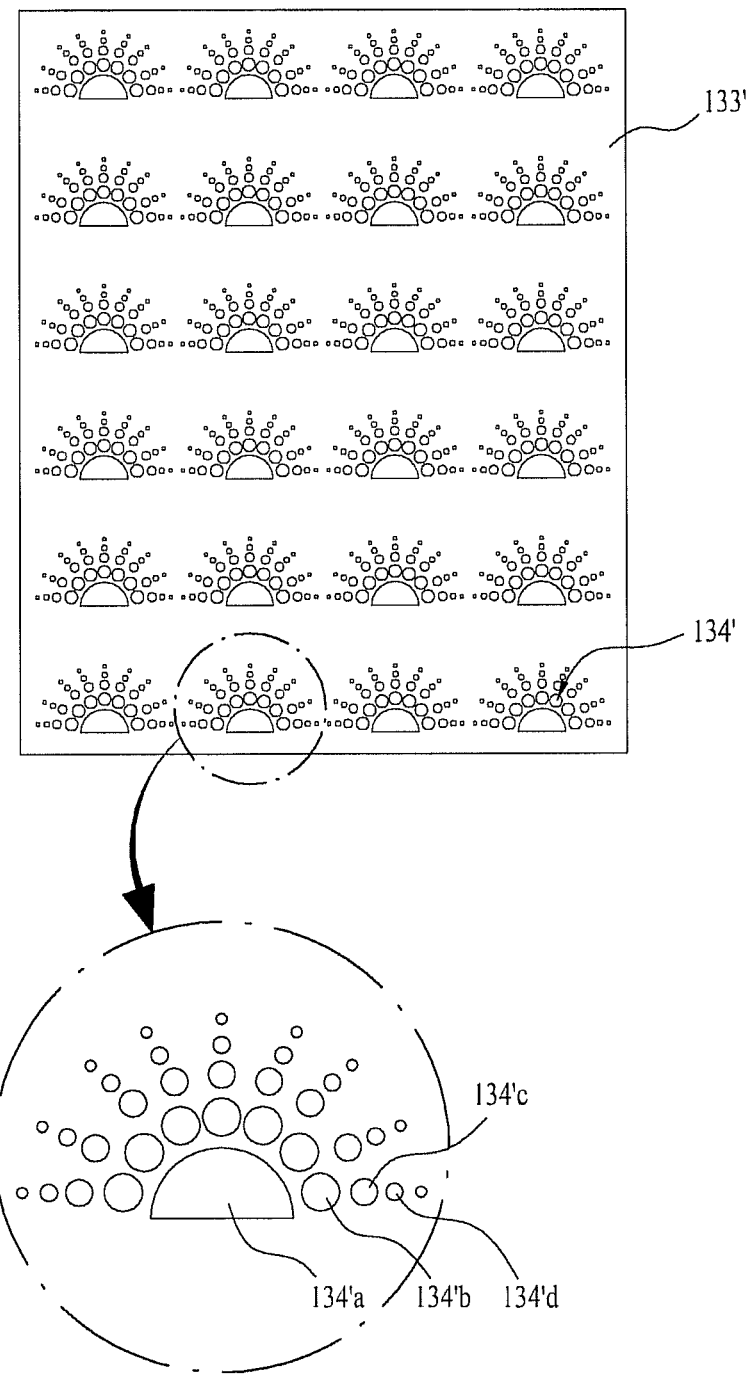
Figure 7:
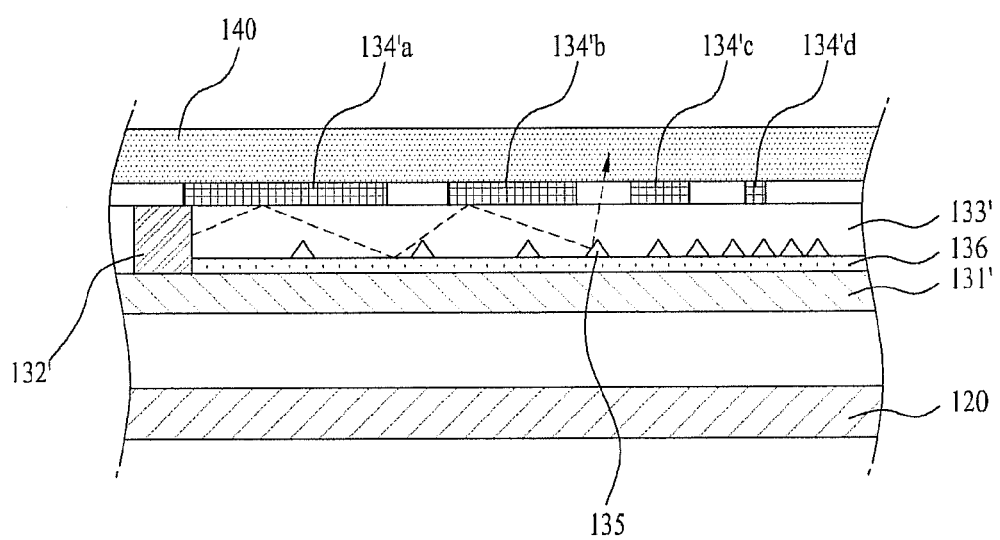

FIGS. 5 to 7 are diagrams illustrating an operational state of the light emitting module composing the lighting apparatus. Especially, FIGS. 5 to 7 are diagrams illustrating the edge type light emitting module 130' shown in FIG. 4 (b).

As shown in a dotted arrow shown of FIG. 5, the light irradiated from a light source 300 is partially incident on a lateral surface of the light guide layer 133' and it travels along an inside of the light guide layer 133', to be reflected into the light guide layer 133' by the reflection layer 134'a closest to the LED 132'. After that, the light is reflected by the reflection layer 134b to 134'd more distance from the LED 132' than the reflection layer 134'a to be provided outside (for example, the diffusive member) via the space formed between the reflection layers 134'a to 134'd.

The light generated by the point light source 132' generally has high brightness. Accordingly, when the light irradiated from the LED 132' is directly observed by an observer, glare may be generated. In this instance, according to the invention, the light irradiated from the LED 132' may be reflected toward the inside of the light guide layer 133' from the reflection layers 134'a to 134'd and the reflected light may be reflected in the light guide layer 133' several times. The light may be emitted toward the front cover 110, having a relatively lower brightness in a state of consuming a predetermined amount of energy. As a result, the glare phenomenon may be prevented effectively.

Also, in reference to FIG. 6, the reflection layers 134'a to 134'd are formed according to a predetermined pattern and the lighting object region may be lighted along the predetermined pattern. According to this embodiment, the reflection layers 134'a to 134'd are formed along a polka-dot pattern spreading to the outside from a center with respect the LED 132'. Of source, such the predetermined pattern is not limited to the pattern shown in FIG. 6 and it can be various according to the surroundings or the user's taste.

As getting distant from the reflection layers 134a to 134d, the density of the predetermined pattern may be decreasing gradually.

In other words, as getting closer to the LED 132', the reflection layers have larger areas (for example, the reflection layer 134'a has the largest area). As getting distant from the LED 132', the reflection layers have smaller areas (for example, the reflection layer 134'd has the smallest area). As mentioned above, as getting distant from the LED 132', the areas of the reflection layers may be gradually getting decreased. In this instance, more uniform lighting may be gained.

As the area or density of the reflection layers is getting increased, the quantity of the lights reflected toward the inside of the light guide layer 133' by the reflection layer may be increased. Accordingly, it is more getting difficult to emit the light near the LED 132' with high brightness via a top of the light guide layer 133' directly. In contrast, as the area or density of the reflection layers are decreased, the quantity of the lights reflected toward the inside of the light guide layer 133' b the reflection layers may be decreased. Accordingly, it is easy and smooth to emit the light distant from the LED 132', with a relatively low brightness, via the top of the light guide layer 133' directly.

As getting farther from the reflection layers 134'a to 134'd, the predetermined area or density of the LED 132' may be gradually decreased.

The reflection layers 134a to 134'd may be ink that is printed on a light transmissive film. Especially, the reflection layer 134'a closest to the LED 132' may be dark color ink to reflect and absorb the lights with the high brightness near the LED appropriately.

Meanwhile, in reference to FIG. 5, a plurality of scratches or dots 135 may be formed on a bottom surface of the light guide layer 133' to reflect the light travelling in the light guide layer 133' to provide the reflected light to the diffusive member 140. The plurality of the scratches or dots 135 may be referenced to as 'a reflection pattern', because they reflect the light travelling in the light guide layer 133' upwardly.

The number of the scratches or dots 135 per a unit area may be in proportion to the distant from the LED 132'. As getting farther from the LED 132', the intensity of the light is getting weaker. In other words, to reflect the lights farther from the LED 132' more than the lights closer to the LED 132' with the high brightness toward the top of the light guide layer 133', the number of the scratches or dots 135 located farther from the LED 132' may be getting increased. Accordingly, more uniform lighting may be achieved. FIG. 5 shows that the density of the scratches or dots 135 is increased as getting farther from the LED 132' as one example of the reflection pattern.

The flexible circuit board 131' may include conductive layer 131'c having a circuit pattern to be electrically connected with the LED 132', a base substrate 131'a provided under the conductive layer 131'c to transmit the heat generated from the LED 132' outside, and an insulative layer 131d provided between the conductive layer 131'c and the base substrate 131'a to prevent electrical connection between the conductive layer 131c and the base substrate 131'a.

The flexible circuit board 131' may include a reflection layer 131'e layered on the conductive layer 131'c to reflect the light irradiated from the LED 132'. The reflection layer 131'e may be formed of Au or Ag and it may upwardly reflect the light emitted from the LED 132' downwardly or reflected by the reflection layer 134', only to emit the light efficiently. In other words, a metal material with a high light reflectance is used to emit the light toward an open top of the light guide layer 133' and highly bright luminosity may be enabled.

Also, the flexible circuit board 131' may further include a nickel (Ni) layer 131'd layered on a top surface of the conductive layer 131'c. The nickel layer 131'd may be employed as a barrier layer provided between a metal material and a semiconductor material to support a carrier (an electron or a hole) of an electric current to prevent the carrier from flowing only to one side easily.

In reference to FIG. 7, the light emitting module 130' may include the reflection pattern 135 provided on a bottom surface of the light guide layer 133' to provide the light travelling inside the light guide layer 133' to the top of the light guide layer 133' and it may further include a reflecting plate provided under the light guide layer 133'. Accordingly, some of the lights travelling inside the light guide layer 133' may be completely prevented from escaping outside through a bottom of the light guide layer 133'.

Figure 2:
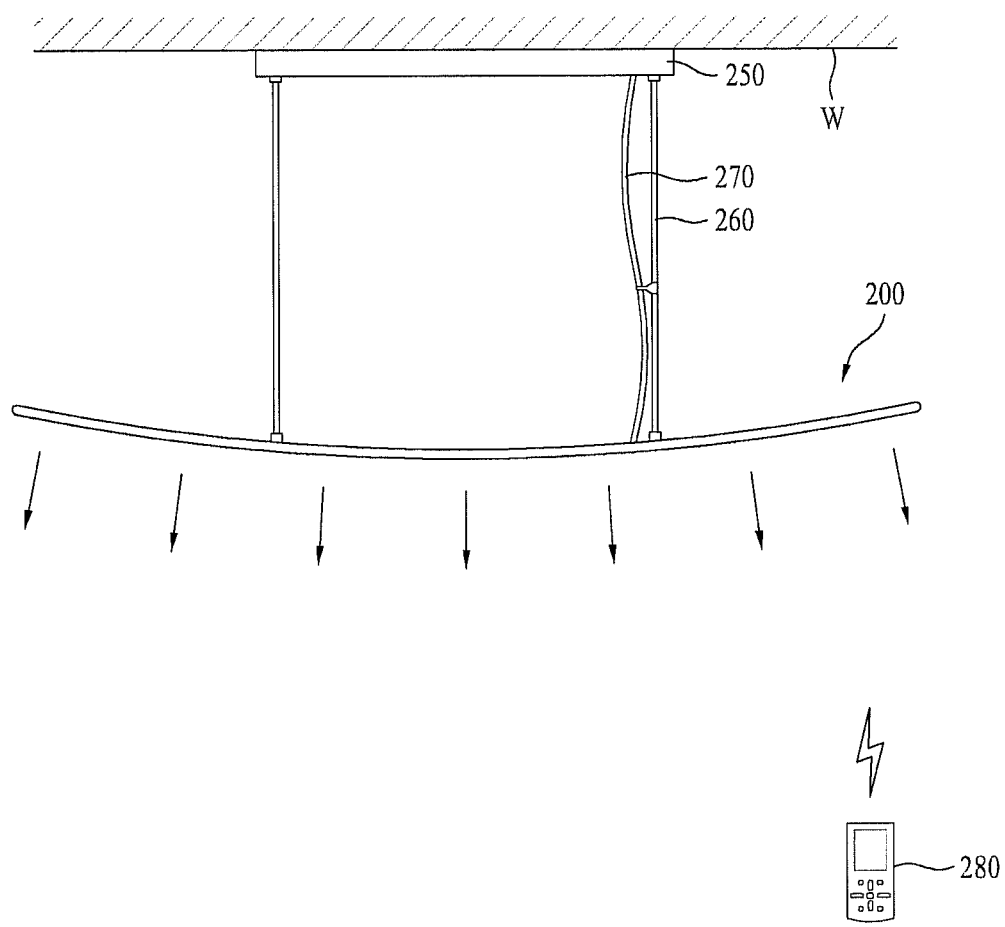
FIG. 2 is a side view illustrating alighting apparatus according to a second embodiment of the invention.

FIG. 2 is a side view illustrating a lighting apparatus according to a second embodiment of the invention.

The lighting apparatus 200 according to the second embodiment includes a front cover (not shown) having a light transmission part, a rear cover (not shown) coupled to the front cover, a light emitting module including a flexible circuit board 231 arranged between the front cover and the rear cover, with a predetermined curvature having a center positioned toward a reverse direction with respect to a lighting room to increase a light distribution region, and a plurality of LEDs 232 mounted on the flexible circuit board 231, and an electronic module 250 to provide an electric power to the light emitting module.

In reference to FIGS. 1 and 2, the lighting apparatus 200 according to the second embodiment has a different configuration that the light emitting module and the covers are curved along a different direction to locate the center (P) of the curvature in opposite to the center of the curvature formed in the lighting apparatus 100 according to the first embodiment.

Specifically, the lighting apparatus 100 according to the second embodiment has a structure capable of lighting a broad lighting room.

In reference to FIGS. 2 and 8, the light emitting module has a curved appearance having the center (P) of the curvature located in opposite to the lighting room (for example, toward a wall) to increase the quantity of the lights in the light distribution region. More specifically, in reference to FIG. 5 (c), the flexible circuit board 231 may be curved along the direction enabling two neighboring LEDs 232 farther from each other. Also, the light emitting module may include both of the direct type and edge type, similar to the light emitting module 130 according to the first embodiment. The light emitting module may include a light guide layer and a reflection layer.

In reference to FIGS. 8 (a) and (b), the quantity of lights in an overlapped region of a light distribution region of two neighboring LEDs 232 may be decreased in the structure of the light emitting module according to this embodiment, when a circuit board 11 where LEDs 11 are mounted is flat like a plate (see FIG. 8 (a)). Accordingly, the light emitting module according to this embodiment has the structure capable of lighting a broad region.

In other words, an entire light distribution angle of the light emitting module according to the second embodiment may be larger based on a curved level of the flexible circuit board 231 than the entire light distribution angle of the light emitting module shown in FIG. 8 (a).

Also, similar to the first embodiment, each of the front and rear covers may have a corresponding appearance to the curved appearance of the flexible circuit board 231. For example, at least one of the front and rear covers may be curved along the same direction as the curved direction of the flexible circuit board 231. It is preferable that the front and rear covers are curved along the same direction as the flexible circuit board 231.

Also, at least one of the front and rear covers may be curved at the same curvature as the flexible circuit board 231. It is preferable that the front and rear covers are curved at the same curvature as the flexible circuit board to have an excellent exterior appearance.

In this instance, the flexible circuit board 231 may be mounted to the rear cover 120 and the curved appearance of the flexible circuit board 231 may be maintained by the curvature of the rear cover.

Also, the lighting apparatus 200 may further include a local controller 280 to switch on and off the light emitting module. The user uses the local controller 280 to start or stop the operation of the lighting apparatus 200 and may control dimming of the lighting apparatus 200.

Like the first embodiment, the lighting apparatus 200 according to this embodiment may be installed on the ceiling as a chandelier type. In this instance, the electronic module 250 may be mounted to a wall (W) and the front and rear covers may be mechanically connected with the electronic module 250. The electronic module 250 and the light emitting module may be electrically connected with each other via a cable 260.

Figure 9:
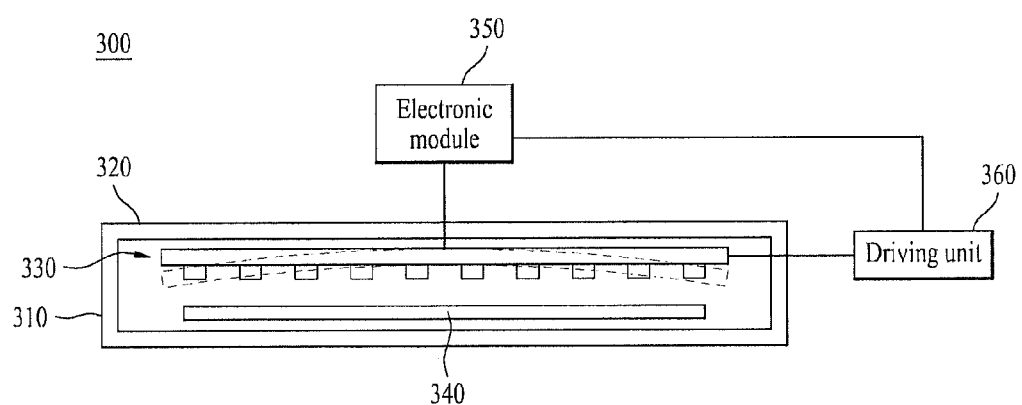
FIG. 9 is a conceptual diagram illustrating a lighting apparatus according to a third embodiment of the invention.

FIG. 9 is a conceptual diagram illustrating a lighting apparatus 300 according to a third embodiment of the invention.

The lighting apparatus 300 may include a front cover 310 having a light transmission part, a rear cover 320 coupled to the front cover 310, a light emitting module 330 arranged between the front cover 310 and the rear cover 320, having a flexible circuit board and a plurality of LEDs mounted on the flexible circuit board, a driving unit 360 to bend the flexible circuit board toward a lighting room or a reverse direction with respect to the lighting room, and an electronic module 350 to provide an electric power to the light emitting module 330 and the driving unit 360.

In the lighting apparatus 100 according to the first embodiment and the lighting apparatus 200 according to the second embodiment, the flexible circuit board has the predetermined curvature fitted to the characteristics of the lighting room. However, in the lighting apparatus 100 according to the third embodiment, the driving unit 360 may adjust a curved direction or a curvature degree to be fitted to the characteristics of the lighting room.

Also, the lighting apparatus 300 may further include a diffusive member 340 arranged between the front cover 310 and the light emitting module 330. The lighting apparatus 300 may further include a local controller (not shown) to control on and off of the light emitting module 220 and a curved level of the flexible circuit board.

When the light emitting module 330 is curved toward the lighting room by the driving unit 360, the lighting apparatus 300 may have the structure enabling intensive lighting according to the first embodiment. When the light emitting module 330 is curved toward the reverse direction with respect to the lighting room by the driving unit 360, the lighting apparatus 300 may have the structure capable of lighting the broad space according to the second embodiment.

Meanwhile, the driving unit 360 may have various structures capable of pressing a predetermined portion of a flexible display to curve the flexible circuit board. For example, the driving unit 360 may include a piezo-electric element variable based on an electrical signal, a cylinder or a motor-gear.

As described above, the lighting apparatus according to the embodiments of the invention may intensively light the lighting room by adjusting the light distribution angle and it may prevent the glare phenomenon. Also, it may improve uniformity of lighting and have an enhanced exterior appearance.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A lighting apparatus comprising:
a front cover having a light transmission part;
a rear cover coupled to the front cover;
a light emitting module arranged between the front cover and the rear cover, the light emitting module including a flexible circuit board, with a predetermined curvature having a center located toward a lighting room to increase quantity of lights in a light distribution region, and a plurality of LEDs mounted on the flexible circuit board;
a driving unit to bend the flexible circuit board toward a lighting room; and
an electronic module to supply an electric power to the light emitting module,
wherein the light emitting module includes:
a light guide layer provided on the flexible circuit board to cover the LEDs, and
a plurality of reflection layers to reflect a light from the LED at a specific light distribution angle toward the light guide layer,
wherein an area or an intensity of the reflection layers decreases as it gets farther from one of the LEDs, and
wherein the driving unit is configured to press a predetermined portion of the flexible circuit board to bend the flexible circuit board.

2. The lighting apparatus according to claim 1, wherein at least one of the front cover and the rear cover is curved at a same curvature as the flexible circuit board.

3. The lighting apparatus according to claim 1, wherein the flexible circuit board is curved toward a direction enabling two neighboring LEDs closer to each other as compared to when the flexible circuit board is flat.

4. The lighting apparatus according to claim 1, wherein a plurality of scratches or dots are formed at a bottom surface of the light guide layer to reflect a light travelling inside the light guide layer toward the front cover.

5. The lighting apparatus according to claim 4, wherein the total number of the scratches or dots per unit area is in proportion to a distance from the LED.

6. The lighting apparatus according to claim 1, further comprising:
a diffusive member arranged between the front cover and the light emitting module.

7. The lighting apparatus according to claim 1, further comprising:
a local controller to control on and off of the light emitting module.

8. The lighting apparatus according to claim 1, wherein a first one of the reflection layers is aligned with one of the LEDs, wherein a second one of the reflection layers is between a third one of the reflection layers and the first one of the reflection layers.

9. The lighting apparatus according to claim 8, wherein an area of the second one of the reflection layers is less than the area of the first one of the reflection layers, and an area of the third one of the reflection layers is less than the area of the second one of the reflection layers.

10. The lighting apparatus according to claim 1, wherein the driving unit moves the flexible circuit board between a first position and a second position.

11. A lighting apparatus comprising:
a front cover having a light transmission part;
a rear cover coupled to the front cover;
a light emitting module including a flexible circuit board arranged between the front cover and the rear cover, with a predetermined curvature having a center positioned toward a reverse direction with respect to a lighting room to increase a light distribution region, and a plurality of LEDs mounted on the flexible circuit board;
a driving unit to bend the flexible circuit board toward a reverse direction with respect to the lighting room; and
an electronic module to provide an electric power to the light emitting module,
wherein the light emitting module includes:
a light guide layer provided on the flexible circuit board to cover the LEDs, and
a plurality of reflection layers to reflect a light from the LED at a specific light distribution angle toward the light guide layer,
wherein an area or an intensity of the reflection layers decreases as it gets farther from the LED, and
wherein the driving unit is configured to press a predetermined portion of the flexible circuit board to bend the flexible circuit board.

12. The lighting apparatus according to claim 11, wherein at least one of the front cover and the rear cover is curved at a same curvature as the flexible circuit board.

13. The lighting apparatus according to claim 11, wherein the flexible circuit board is curved toward a direction enabling two neighboring LEDs farther to each other as compared to when the flexible circuit board is flat.

14. The lighting apparatus according to claim 11, wherein a plurality of scratches or dots are formed at a bottom surface of the light guide layer to reflect a light travelling inside the light guide layer toward the front cover.

15. The lighting apparatus according to claim 14, wherein the total number of the scratches or dots per unit area is in proportion to a distance from the LED.

16. The lighting apparatus according to claim 11, further comprising:
a diffusive member arranged between the front cover and the light emitting module.

17. The lighting apparatus according to claim 11, wherein a first one of the reflection layers is aligned with one of the LEDs, wherein a second one of the reflection layers is between a third one of the reflection layers and the first one of the reflection layers, and wherein an area of the second one of the reflection layers is less than an area of the first one of the reflection layers, and an area of the third one of the reflection layers is less than the area of the second one of the reflection layers.

18. The lighting apparatus according to claim 11, wherein the driving unit moves the flexible circuit board between a first position and a second position.

19. A lighting apparatus comprising:
a front cover having a light transmission part;
a rear cover coupled to the front cover;
a light emitting module arranged between the front cover and the rear cover, the light emitting module including a flexible circuit board and a plurality of LEDs mounted on the flexible circuit board;
a driving unit to bend the flexible circuit board toward a lighting room or a reverse direction with respect to the lighting room; and
an electronic module to provide an electric power to the light emitting module and the driving unit,
wherein the light emitting module includes:
a light guide layer provided on the flexible circuit board to cover the LEDs, and a plurality of reflection layers to reflect a light from the LED at a specific light distribution angle toward the light guide layer, wherein an area or an intensity of the reflection layers decreases as it gets farther from the LED, and wherein the driving unit is configured to press a predetermined portion of the flexible circuit board to bend the flexible circuit board.

20. The lighting apparatus according to claim 19, further comprising:

a diffusive member arranged between the front cover and the light emitting module.

21. The lighting apparatus according to claim 19, further comprising:

a local controller to control on and off of the light emitting module and curbing of the flexible circuit board.

22. The lighting apparatus according to claim 19, wherein a first one of the reflection layers is aligned with one of the LEDs, wherein a second one of the reflection layers is between a third one of the reflection layers and the first one of the reflection layers, and wherein an area of the second one of the reflection layers is less than an area of the first one of the reflection layers, and an area of the third one of the reflection layers is less than the area of the second one of the reflection layers.

23. The lighting apparatus according to claim 19, wherein the driving unit moves the flexible circuit board between a first position and a second position.

\* \* \* \* \*